(12) United States Patent
Harada et al.

(10) Patent No.: US 10,617,018 B2
(45) Date of Patent: Apr. 7, 2020

(54) CIRCUIT BOARD AND CONTROL DEVICE

(71) Applicant: NIDEC ELESYS CORPORATION, Kawasaki-shi, Kanagawa (JP)

(72) Inventors: Kazuki Harada, Kawasaki (JP); Naoki Yamamoto, Kawasaki (JP)

(73) Assignee: NIDEC ELESYS CORPORATION, Kanagawa (JP)

(*) Notice: Subject to any disclaimer, the term of this patent is extended or adjusted under 35 U.S.C. 154(b) by 0 days.

(21) Appl. No.: 16/145,473

(22) Filed: Sep. 28, 2018

(65) Prior Publication Data

US 2019/0104621 A1 Apr. 4, 2019

(30) Foreign Application Priority Data

Sep. 29, 2017 (JP) .................. 2017-191166

(51) Int. Cl.
| | |
|---|---|
| *H05K 7/10* | (2006.01) |
| *H05K 7/12* | (2006.01) |
| *H05K 5/00* | (2006.01) |
| *H05K 1/11* | (2006.01) |

(Continued)

(52) U.S. Cl.
CPC ......... *H05K 5/0017* (2013.01); *B62D 5/0406* (2013.01); *H02K 11/33* (2016.01); *H02P 27/08* (2013.01); *H05K 1/111* (2013.01); *H05K 1/181* (2013.01); *H05K 5/0008* (2013.01); *H05K 5/0052* (2013.01); *H05K 7/1432* (2013.01);

(Continued)

(58) Field of Classification Search
CPC ........ B62D 5/04; B62D 5/0406; H02K 11/33; H02K 2211/03; H02M 7/003; H02M 7/53871; H02P 27/08; H05K 1/111; H05K 1/181; H05K 2201/10015; H05K 2201/10409; H05K 2201/10522; H05K 5/0008; H05K 5/0017; H05K 5/0052; H05K 7/1432
See application file for complete search history.

(56) References Cited

U.S. PATENT DOCUMENTS

| | | | | |
|---|---|---|---|---|
| 5,420,378 A | * | 5/1995 | Estes | ................... H05K 1/0215 174/261 |
| 10,340,692 B2 | * | 7/2019 | Testani | ..................... G05F 1/00 |

(Continued)

FOREIGN PATENT DOCUMENTS

JP   5777797 B2   9/2015

*Primary Examiner* — Yuriy Semenenko
(74) *Attorney, Agent, or Firm* — Keating & Bennett

(57) ABSTRACT

A circuit board includes a board, circuitry provided on the board that supplies electric power to a motor, a positive-electrode-side power source terminal portion connected to a positive electrode terminal of the circuitry, and a negative-electrode-side power source terminal portion connected to a negative electrode terminal of the circuitry. The circuitry includes a first capacitor connected to the positive-electrode-side power source terminal portion, and a second capacitor connected to the negative-electrode-side power source terminal portion. The first and second capacitors are connected in series between the positive-electrode-side and the negative-electrode-side power source terminal portions. The board includes a through hole, at least a portion of which is between at least two of the first capacitor, the second capacitor, the positive-electrode-side power source terminal portion, and the negative-electrode-side power source terminal portion.

18 Claims, 12 Drawing Sheets

(51) Int. Cl.
    *H05K 1/18*     (2006.01)
    *H02P 27/08*     (2006.01)
    *H02K 11/33*     (2016.01)
    *H05K 7/14*     (2006.01)
    *B62D 5/04*     (2006.01)
    *H02M 7/5387*     (2007.01)
    *H02M 7/00*     (2006.01)

(52) U.S. Cl.
    CPC ............ *B62D 5/04* (2013.01); *H02K 2211/03* (2013.01); *H02M 7/003* (2013.01); *H02M 7/53871* (2013.01); *H05K 2201/10015* (2013.01); *H05K 2201/10409* (2013.01); *H05K 2201/10522* (2013.01)

(56) References Cited

U.S. PATENT DOCUMENTS

| | | | | |
|---|---|---|---|---|
| 2009/0237905 | A1* | 9/2009 | Motoda | H05K 1/144 361/784 |
| 2010/0025126 | A1* | 2/2010 | Nakatsu | B60L 11/00 180/65.1 |
| 2011/0221268 | A1* | 9/2011 | Kanazawa | H05K 1/0263 307/10.1 |
| 2011/0235270 | A1* | 9/2011 | Nakatsu | H02M 7/003 361/689 |
| 2013/0033098 | A1* | 2/2013 | Nagashima | B60T 7/042 303/199 |
| 2014/0103851 | A1* | 4/2014 | Arefeen | H02M 7/5387 318/503 |
| 2014/0300304 | A1 | 10/2014 | Omae et al. | |
| 2015/0305188 | A1* | 10/2015 | Maeda | H05K 7/1432 361/728 |
| 2015/0340966 | A1* | 11/2015 | Mutsuura | H02M 7/003 363/98 |
| 2016/0036296 | A1* | 2/2016 | Kabune | H02K 11/33 180/446 |
| 2016/0036305 | A1* | 2/2016 | Kawata | B62D 5/0412 180/443 |
| 2016/0244088 | A1* | 8/2016 | Hagiwara | B62D 5/0406 |

\* cited by examiner

CIRCUIT BOARD AND CONTROL DEVICE

CROSS REFERENCE TO RELATED APPLICATIONS

This application claims the benefit of priority to Japanese Patent Application No. 2017-191166 filed on Sep. 29, 2017. The entire contents of this application are hereby incorporated herein by reference.

BACKGROUND OF THE INVENTION

1. Field of the Invention

An aspect of the present invention relates to a circuit board and a control device.

2. Description of the Related Art

A vehicle such as an automobile includes an electric power steering system as an on-board device, for example. The electric power steering system generates an assist torque for assisting a steering torque of a steering system upon receiving the operation of a steering handle by a driver. The electric power steering system can reduce the burden of the driving operation on the driver by generating the assist torque. An assist torque mechanism that generates the assist torque detects the steering torque, generates a drive signal on the basis of a detection signal, and generates the assist torque with a motor on the basis of the drive signal. As a result, the assist torque corresponding to the steering torque is transmitted to the steering system via a speed reduction mechanism.

With regard to the above-mentioned feature, an electric power steering system including a motor driving device is disclosed in Japanese Patent Laid-Open No. 5777797, for example. The electric power steering system includes a common mode filter in the motor driving device. The common mode filter includes a common mode coil and a capacitor. However, the common mode coil increases the size of the common mode filter. Meanwhile, a common mode filter without the common mode coil can reduce the size of the motor driving device but cannot sufficiently reduce a common mode noise.

SUMMARY OF THE INVENTION

According to preferred embodiments of this invention, a circuit board includes a board main body; circuitry provided on the board main body that supplies electric power to a motor; a positive-electrode-side power source terminal portion provided on the board main body and connected to a positive electrode terminal of the circuitry; and a negative-electrode-side power source terminal portion provided on the board main body and connected to a negative electrode terminal of the circuitry. The circuitry includes a first capacitor connected to the positive-electrode-side power source terminal portion; and a second capacitor connected to the negative-electrode-side power source terminal portion, and the first capacitor and the second capacitor are connected in series between the positive-electrode-side power source terminal portion and the negative-electrode-side power source terminal portion. The board main body includes a through hole penetrating through the board main body in a thickness direction, and at least a portion of the through hole is provided in a position between at least two of the first capacitor, the second capacitor, the positive-electrode-side power source terminal portion, and the negative-electrode-side power source terminal portion.

According to preferred embodiments of the present invention, a reduction in generated noise is obtained.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Circuit boards and control devices according to preferred embodiments of the present invention are described below with reference to the drawings.

Figure 1:
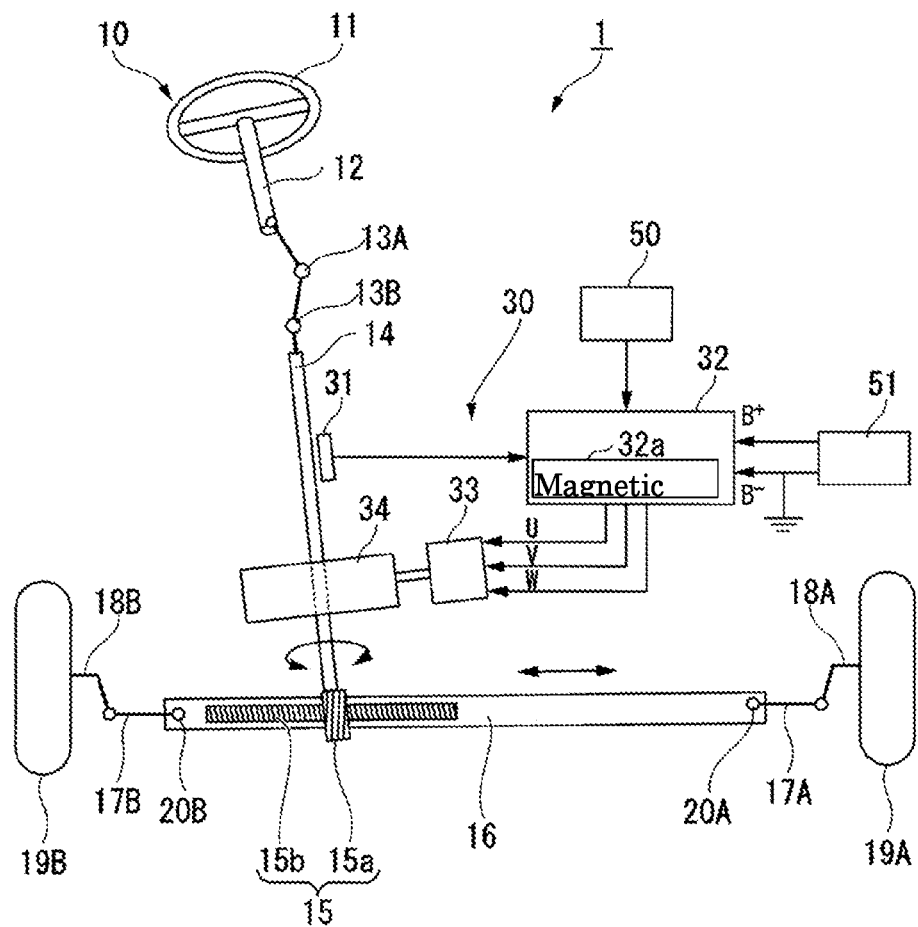
FIG. 1 is a schematic view showing a configuration example of an electric power steering system of a preferred embodiment of the present invention.

FIG. 1 is a schematic view showing a configuration example of an electric power steering system 1 of a preferred embodiment of the present invention. The electric power steering system 1 preferably includes a steering system 10, an assist torque mechanism assembly 30, a control device 50, and a battery 51, for example. The electric power steering system 1 transmits an assist torque generated by the assist torque mechanism assembly 30 to the steering system 10. The electric power steering system 1 generates the assist torque, and hence defines and functions as a motor driving device that drives a motor described below.

The steering system 10 preferably includes a steering wheel 11, a steering shaft 12, universal joints 13A and 13B, a rotating shaft portion 14, a rack-and-pinion mechanism 15, a rack shaft portion 16, tie rods 17A and 17B, knuckles 18A and 18B, steered wheels 19A and 19B, and ball joints 20A and 20B.

The steering wheel 11 is steered by a driver of a vehicle. The steering shaft 12, the universal joints 13A and 13B, and the rotating shaft portion 14 (also referred to as a pinion shaft or an input shaft) are linked to the steering wheel 11 in the stated order. The rack shaft portion 16 is linked to the rotating shaft portion 14 via the rack-and-pinion mechanism 15. The right and left steered wheels 19A and 19B are linked to both ends of the rack shaft portion 16 via the right and left ball joints 20A and 20B, the right and left tie rods 17A and 17B, and the right and left knuckles 18A and 18B. The rack-and-pinion mechanism 15 includes a pinion 15*a* and a rack 15*b*. The pinion 15*a* is linked to the rotating shaft portion 14. The rack 15*b* is included in the rack shaft portion 16.

According to the steering system 10, when the driver steers the steering wheel 11, the steered wheels 19A and 19B can be steered via the rack-and-pinion mechanism 15 by a steering torque.

The assist torque mechanism assembly 30 preferably includes a steering torque detection assembly 31, an electronic control circuit 32, a motor 33, and a speed reduction mechanism assembly 34, for example.

The steering torque detection assembly 31 is a steering torque sensor, for example. The steering torque detection assembly 31 detects the steering torque applied to the steering wheel 11 and generates a torque signal.

The motor 33 is preferably a motor including a three-phase motor power source terminal including a U-phase, a V-phase, and a W-phase, for example. The motor 33 is preferably a brushless motor, for example. The motor 33 generates the assist torque in accordance with the drive signal. The assist torque is transmitted to the rotating shaft portion 14 via the speed reduction mechanism assembly 34.

The speed reduction mechanism assembly 34 is preferably a worm gear mechanism, for example. The assist torque transmitted to the rotating shaft portion 14 is transmitted to the rack-and-pinion mechanism 15 from the rotating shaft portion 14.

The electronic control circuit 32 preferably includes a power source circuit, a current sensor that detects a motor current (actual current), a microprocessor, an FET (Field effect transistor) bridge circuit, and a magnetic sensor 32*a*, for example. The magnetic sensor 32*a* detects the angle of rotation of a rotor in the motor 33. The rotor is preferably a permanent magnet rotor, for example, and the magnetic sensor 32*a* detects the angle of rotation of the rotor by detecting the motion of the permanent magnet (the N-pole and the S-pole).

The electronic control circuit 32 receives input of not only the torque signal but also a vehicle speed signal as an external signal, for example. The electronic control circuit 32 calculates the assist torque to be generated in the motor 33 with respect to the steering torque indicated by the torque signal. The electronic control circuit 32 generates a drive signal so as to generate the calculated assist torque in the motor 33.

The control device 50 is an electronic control circuit that communicates with other electronic control circuits through an in-vehicle network such as a CAN (Controller Area Network), for example. The control device 50 may be a vehicle speed sensor that can output a vehicle speed pulse corresponding to the vehicle speed signal, for example. The external signal includes a signal of the electric power steering system 1 such as the torque signal and a signal (vehicle-body signal) of the vehicle such as the vehicle speed signal. The vehicle-body signal may include not only communicate signals such as the vehicle speed signal and engine speed but also a signal indicating ON or OFF of an ignition switch.

The microprocessor of the electronic control circuit 32 performs vector control of the motor 33 by operating the FET bridge circuit on the basis of the torque signal and the vehicle speed signal, for example. The FET bridge circuit is an inverter circuit INV (see FIG. 2) that carries a drive current (three-phase alternating current) to the motor 33, for example. The FET bridge circuit preferably includes an FET 1, an FET 2, an FET 3, an FET 4, an FET 5, and an FET 6 as shown in FIG. 2, for example.

The electronic control circuit 32 sets a target current on the basis of at least the torque signal indicating the steering torque. The electronic control circuit 32 preferably sets the target current by also taking the vehicle speed of the vehicle and the angle of rotation of the rotor into consideration. The electronic control circuit 32 controls the drive current (drive signal) of the motor 33 so that the motor current (actual current) coincides with the target current.

The battery 51 is a storage battery that accumulates electric power to be supplied to the electronic control circuit 32. Reference character B+ denotes an electric potential of a positive electrode of the battery 51 provided in the vehicle as a direct-current power source, for example, and reference character B− denotes an electric potential of a negative electrode of the battery 51. The electric potential B− of the negative electrode is grounded to a vehicle body of the vehicle. Note that the electronic control circuit 32 includes, on a power source connector PCN that is an external connector, terminals (a positive terminal T+ and a negative terminal T−) that are portions to be connected or brought into contact with a terminal on the battery 51 side. A power source voltage as a difference between the electric potential B+ of the positive electrode and the electric potential B− of the negative electrode becomes a source of a drive voltage of the motor 33.

Figure 2:
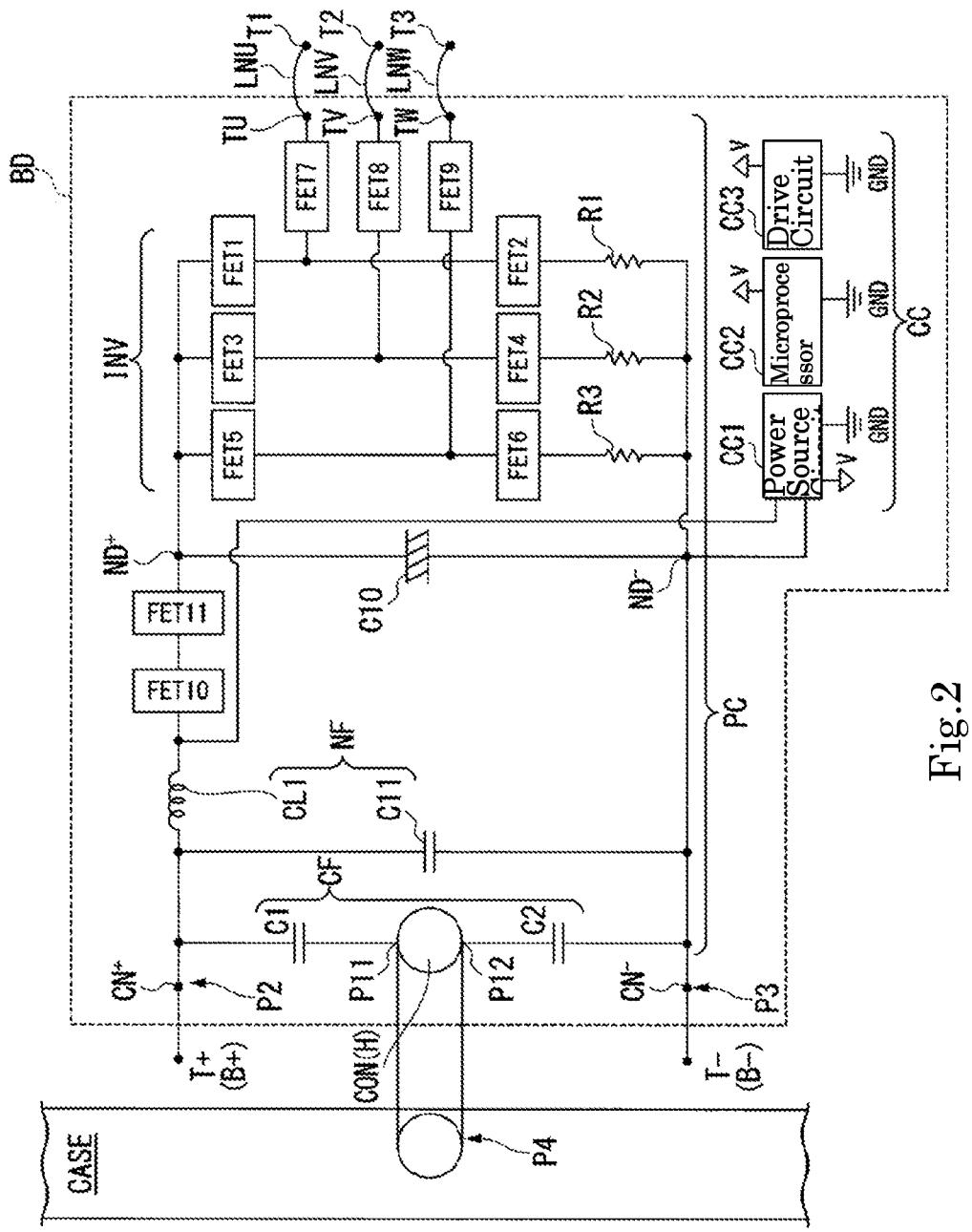
FIG. 2 is a circuit diagram showing an inner configuration example of an electronic control circuit of a preferred embodiment of the present invention.

FIG. 2 is a circuit diagram showing an inner configuration example of the electronic control circuit 32. The electronic control circuit 32 generates the assist torque based on the steering torque with use of the motor 33, but the usage of the electronic control circuit 32 in FIG. 2 is not limited thereto. That is, the electronic control circuit 32 in FIG. 2 only needs to be able to drive a three-phase alternating motor, and the microprocessor in FIG. 2 only needs to be able to control the drive current through the three-phase alternating motor on the basis of an arbitrary signal.

The electronic control circuit 32 is preferably provided on a circuit board BD. A board positive connection portion CN+, a board negative connection portion CN−, and inverter output terminals TU, TV, and TW are provided on the circuit board BD. The battery 51 is connected to the board positive connection portion CN+ and the board negative connection portion CN−. The motor 33 is connected to the inverter output terminals TU, TV, and TW. A power circuitry PC is connected between the board positive connection portion CN+ and the board negative connection portion CN− and the inverter output terminals TU, TV, and TW.

The positive terminal T+ is connected to the board positive connection portion CN+. The positive terminal T+ corresponds to an input terminal that inputs the electric potential B+ of the positive electrode of the battery 51. The electric potential B+ of the positive electrode of the battery 51 is provided to the positive terminal T+. The electric potential B+ is transmitted to the board positive connection portion CN+.

The negative terminal T− is connected to the board negative connection portion CN−. The negative terminal T− corresponds to an input terminal that inputs the electric potential B− of the negative electrode of the battery 51. The negative terminal T− is connected to the board negative connection portion CN−. The electric potential B− of the negative electrode of the battery 51 is provided to the negative terminal T−. The electric potential B− is transmitted to the board negative connection portion CN−. When the negative terminal T− is grounded to the vehicle body of the vehicle, the electric potential B− is the same electric potential as a GND electric potential of the vehicle body. The inverter circuit INV preferably includes six FETs, that is, FET 1 to FET 6, for example. The six FETs, that is, FET 1 to FET 6 are connected between a positive electrode line of the electric potential B+ connected to the board positive connection portion CN+ and a negative electrode line of the electric potential B− connected to the board negative connection portion CN−. An electrolytic capacitor C10 is connected between the positive electrode line and the negative electrode line to be in parallel with the inverter circuit INV. The electrolytic capacitor C10 smooths the power source voltage (the difference between the electric potential B+ and the electric potential B−).

The FET 1 and the FET 2 are connected in series between the positive electrode line and the negative electrode line. The FET 1 and the FET 2 supply a U-phase current to a U-winding of the motor 33. A shunt resistor R1 is connected between the FET 2 and the negative electrode line to be in series with the FET 1 and the FET 2. The current flowing through the shunt resistor R1 is detected by a current sensor (not shown) that detects the U-phase current. The FET 7 is connected between a line that connects the FET 1 and the FET 2 with each other and the inverter output terminal TU. The FET 7 blocks or carries the U-phase current.

The FET 3 and the FET 4 are connected in series between the positive electrode line and the negative electrode line. The FET 3 and the FET 4 supply a V-phase current to a V-winding of the motor 33. A shunt resistor R2 is connected between the FET 4 and the negative electrode line in series with the FET 3 and the FET 4. The current flowing through the shunt resistor R2 is detected by a current sensor (not shown) that detects the V-phase current. The FET 8 is connected between a line that connects the FET 3 and the FET 4 with each other and the inverter output terminal TV. The FET 8 blocks or carries the V-phase current.

The FET 5 and the FET 6 are connected in series between the positive electrode line and the negative electrode line. The FET 5 and the FET 6 supply a W-phase current to a W-winding of the motor 33. A shunt resistor R4 is connected between the FET 6 and the negative electrode line so as to be in series with the FET 5 and the FET 6. The current flowing through the shunt resistor R3 is detected by a current sensor (not shown) that detects the W-phase current. The FET 9 is connected between a line that connects FET 5 and FET 6 with each other and the inverter output terminal TW. The FET 9 blocks or carries the W-phase current.

The inverter output terminal TU is connected to a motor power source terminal T1 of the motor 33 via a power source line portion LNU. The inverter output terminal TV is connected to a motor power source terminal T2 of the motor 33 via a power source line portion LNV. The inverter output terminal TW is connected to a motor power source terminal T3 of the motor 33 via a power source line portion LNW.

The FET 1 to the FET 6 supply the U-phase current, the V-phase current, and the W-phase current to the motor 33 by each being controlled by PWM control. As a semiconductor relay that can block the electric power, an FET 10 and an FET 11, for example, are connected to a stage preceding a node ND+ of the positive electrode line that connects the inverter circuit INV and the electrolytic capacitor C10 with each other. Further, a normal mode filter NF is provided in a stage preceding the FET 10 and the FET 11. The normal mode filter NF includes a coil CL1 and a capacitor C11. The coil CL1 is connected between the FET 10 and the board positive connection portion CN+. The capacitor C11 is connected between the positive electrode line and the negative electrode line so as to be in parallel with the electrolytic capacitor C10. The normal mode filter NF reduces a normal mode noise superimposed on the positive electrode line.

A common mode filter CF is connected to a stage preceding the normal mode filter NF. In the common mode filter CF, for example, a first capacitor C1 and a second capacitor C2 are preferably connected to be in parallel with the electrolytic capacitor C10. The first capacitor C1 and the second capacitor C2 are connected in series between the positive electrode line and the negative electrode line.

The common mode filter CF is connected between the board positive connection portion CN+ and the board negative connection portion CN−. Specifically, one end of the first capacitor C1 is connected to the board positive connection portion CN+ via the positive electrode line. One end of the second capacitor C2 is connected to the board negative connection portion CN− via the negative electrode line. The other end of the first capacitor C1 is connected to a position P11 of a conductor portion CON. The other end of the second capacitor C2 is connected to a position P12 of the conductor portion CON.

The conductor portion CON is a material through which current due to the common mode noise is able to flow. The conductor portion CON is provided in a through hole H. The through hole H is a hole penetrating through the circuit board BD in the thickness direction of the circuit board BD. The conductor portion CON is electrically connected to a conductor pattern connected to the other end of the first capacitor C1 and is electrically connected to a conductor pattern connected to the other end of the second capacitor C2. In addition, the conductor portion CON is electrically connected to a conductive section P4 in a case CASE. As a result, the conductor portion CON causes current to flow between the first capacitor C1 and the second capacitor C2 and causes current to flow between the first capacitor C1 and the second capacitor C2 and the case CASE.

The electric potential of the section P4 in the case CASE is different from the electric potential B− (GND electric potential), but it is preferred that the section P4 be also grounded to the vehicle body of the vehicle. When the electric potential of the section P4 in the case CASE is the electric potential B− (GND electric potential), the conductor portion CON can further reduce the common mode noise.

Control circuitry CC is preferably further provided on the circuit board BD. The control circuitry CC includes a drive circuit that generates six control signals (gate signals) corresponding to the FET 1 to the FET 6 on the basis of the target current, and the drive signal (drive current) is supplied to the electric motor 33 by turning the FET 1 to the FET 6 ON or OFF by six control signals. The control circuitry CC preferably includes a power source circuit CC1, a microprocessor CC2, and a drive circuit CC3. The power source circuit CC1 generates the power source voltage (a difference between an electric potential V and the electric potential GND) across the additional control circuitry CC by receiving the power source voltage (a difference between the electric potential B+ and the electric potential B− (electric potential GND)) across the power circuitry PC at a connection point between the FET 10 and the coil CL1 and a node ND−, for example. The microprocessor CC2 sets the target current of the motor 33. The drive circuit CC3 generates control signals that turn the FET 1 to the FET 6 in the inverter circuit INV ON or OFF and supplies control signals to the FET 1 to the FET 6.

The microprocessor CC2 controls the FET 7 to the FET 11. The microprocessor CC2 determines the ON or OFF states of the FET 7 to the FET 11. The drive circuit CC3 generates five control signals corresponding to the FET 7 to the FET 11 on the basis of the determined result and supplies the control signals to the FET 7 to the FET 11.

Figure 3:
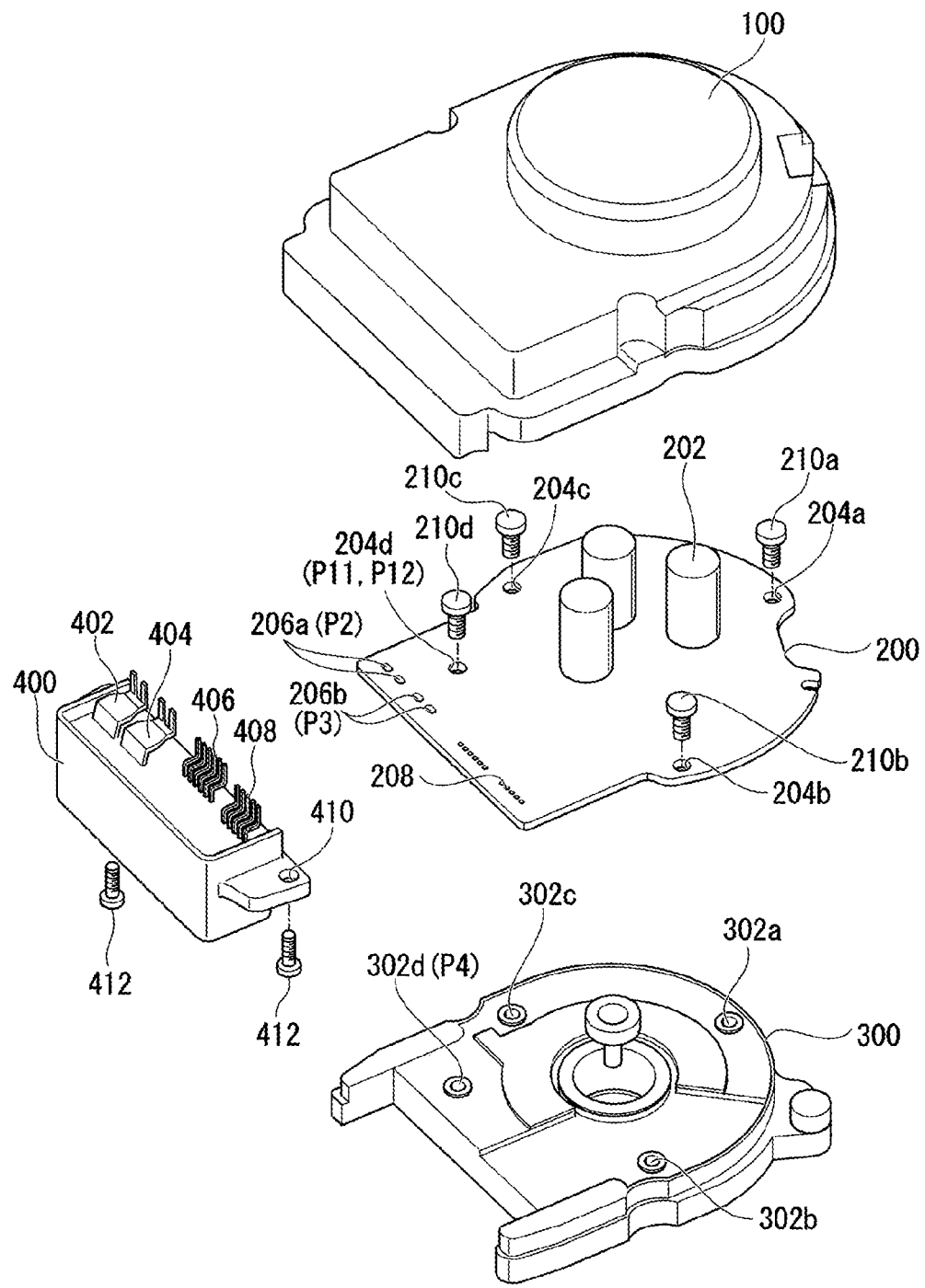
FIG. 3 is an example of an exploded perspective view of the electronic control circuit.

FIG. 3 is an example of an exploded perspective view of the electronic control circuit 32. The electronic control circuit 32 preferably includes a cover assembly 100, a circuit board 200, and a board mounting assembly 300, for example. The electronic control circuit 32 preferably sandwiches the circuit board 200 between the cover assembly 100 and the board mounting assembly 300.

Figure 4A:
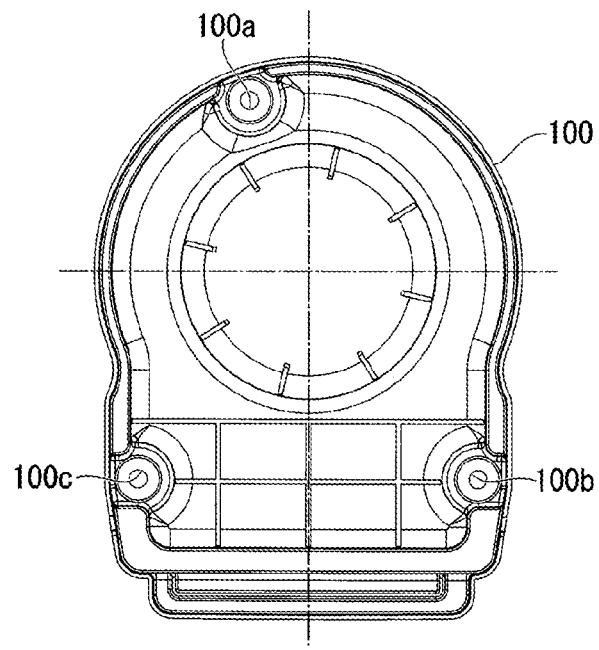
FIG. 4A is a plan view of a cover assembly of a preferred embodiment of the present invention.

FIG. 4A is a plan view of the cover assembly 100. FIG. 4A is a view of the cover assembly 100 seen from a lower side in FIG. 3. The cover assembly 100 is preferably a metallic cover, for example. The cover assembly 100 has a size that does not externally expose the circuit board 200. In addition, the cover assembly 100 preferably has a protruding shape in accordance with circuit components 202 mounted on the circuit board 200, for example. Further, in the cover assembly 100, positions corresponding to portions to be fastened have protruding shapes as shown in FIG. 4A.

Figure 4B:
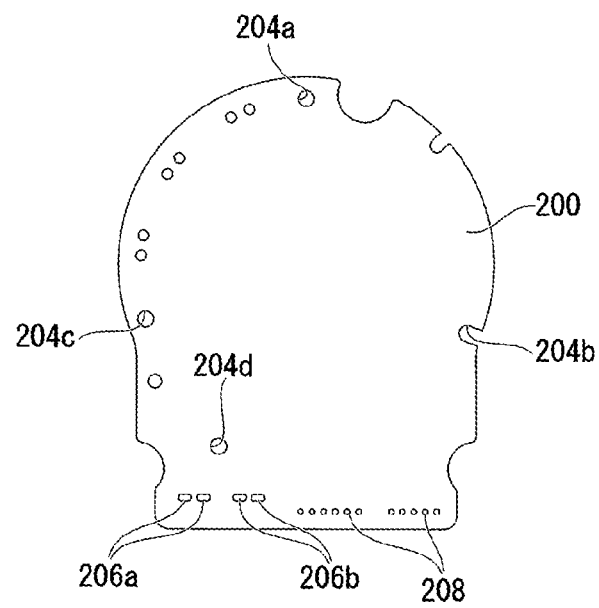
FIG. 4B is a plan view of a circuit board of a preferred embodiment of the present invention.

FIG. 4B is a plan view of the circuit board 200. The circuit board 200 corresponds to the circuit board BD. The circuit components 202 such as the electrolytic capacitor C10 are mounted on the circuit board 200. Through holes 204*a*, 204*b*, 204*c*, and 204*d*, driving power source attachment holes 206*a* and 206*b*, and control signal attachment holes 208 are provided in the circuit board 200, for example. Note that the through hole is simply referred to as a "through hole 204" when no distinction is made between the through hole and other through holes. Note that a driving power source attachment hole is simply referred to as a "driving power source attachment hole 206" when no distinction is made between the driving power source attachment hole and other driving power source attachment holes.

The through holes 204*a*, 204*b*, and 204*c* are provided near an outer end portion of the circuit board 200. The through hole 204*d* is provided on the inner side of the outer end portion of the circuit board 200. The through hole 204*d* corresponds to the through hole H. The position in which the through hole 204*d* is provided corresponds to the positions P11 and P12.

A screw 210*a* is inserted into the through hole 204*a*. A screw 210*b* is inserted into the through hole 204*b*. A screw 210*c* is inserted into the through hole 204*c*. A screw 210*d* is inserted into the through hole 204*d*. The screws 210*a*, 210*b*, 210*c*, and 210*d* are inserted into screw holes 302*a*, 302*b*, 302*c*, and 302*d* in the board mounting assembly 300 via the through holes 204*a*, 204*b*, 204*c*, and 204*d*. The screws 210*a*, 210*b*, 210*c*, and 210*d* screw the circuit board 200 and the board mounting assembly 300 together by a screwing process.

The screw 210*a*, the screw 210*b*, and the screw 210*c* are preferably conductors, but are not limited thereto and do not necessarily need to be conductors. The screw 210*d* is a conductor. The screw 210*d* corresponds to the conductor portion CON.

A positive terminal 402 of a power source unit 400 is inserted into the driving power source attachment holes 206*a* from a surface opposite to a mounting surface of the power circuitry PC. The driving power source attachment holes 206*a* are electrically connected to the power source unit 400 by being mechanically connected to the positive terminal 402 of the power source assembly 400. A negative terminal 404 of the power source assembly 400 is inserted into the driving power source attachment holes 206*b* from the surface opposite to the mounting surface of the power circuitry PC. The driving power source attachment holes 206*b* are electrically connected to the power source assembly 400 by being mechanically connected to the negative terminal 404 of the power source assembly 400.

Signal connection terminals 406 and 408 of the power source assembly 400 are inserted into the control signal attachment holes 208 from the surface opposite to the mounting surface of the power circuitry PC. The control signal attachment holes 208 are positive terminals electrically connected to the power source assembly 400 by being mechanically connected to the signal connection terminals 406 and 408 of the power source assembly 400.

Figure 4C:
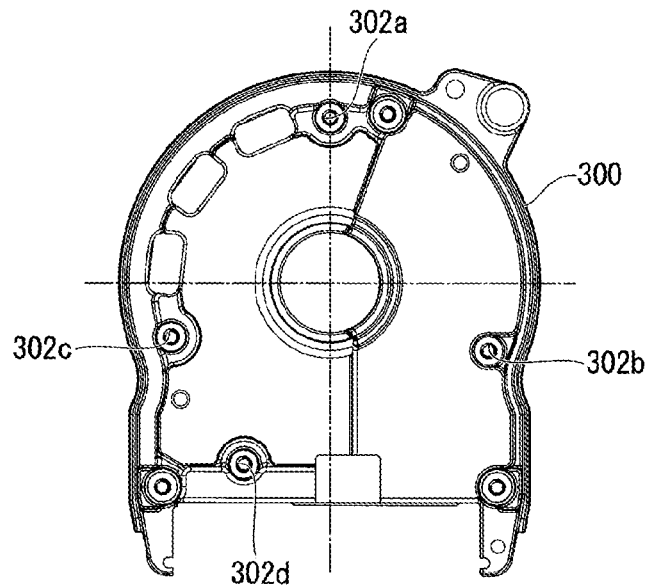
FIG. 4C is a plan view of a board mounting assembly of a preferred embodiment of the present invention.

FIG. 4C is a plan view of the board mounting assembly 300. The board mounting assembly 300 is a heat sink, for example, but is not limited thereto. The board mounting assembly 300 may be a bearing holder, for example. In addition, the board mounting assembly 300 may be an assembly in which a heat sink and a bearing holder are integrated. A motor case (not shown) is screwed on a surface of the board mounting assembly 300 that is opposite to the surface on which the circuit board 200 is mounted. The motor case is a housing that accommodates the motor 33.

The screw holes 302*a*, 302*b*, 302*c*, and 302*d* are provided in the board mounting assembly 300. The screw holes 302*a*, 302*b*, and 302*c* are provided near an outer end portion of the board mounting assembly 300. The screw hole 302*d* is provided on the inner side of the outer end portion of the board mounting assembly 300. The position in which the screw hole 302*d* is provided corresponds to the position P4.

The screw 210*a* inserted into the through hole 204*a* is inserted into the screw hole 302*a*. The screw 210*b* inserted into the through hole 204*b* is inserted into the screw hole 302*b*. The screw 210*c* inserted into the through hole 204*c* is inserted into the screw hole 302*c*. The screw 210*d* inserted into the through hole 204*d* is inserted into the screw hole 302*d*.

At least a portion of the board mounting assembly 300 is defined by a conductor. Specifically, a portion of the board mounting assembly 300 which includes the screw hole 302*d* is defined by a conductor. It is desired that a portion of the board mounting assembly 300 including the screw hole 302*d* be connected to a ground terminal (not shown) and have the same electric potential as the ground electric potential GND.

The power source assembly 400 positive terminal includes the positive terminal 402, the negative terminal 404, and the signal connection terminals 406 and 408, for example. In addition, a screw hole 410 used in fixing the power source assembly 400 and the board mounting assembly 300 together is provided in the power source assembly 400. In the fixing process, the power source assembly 400 is mechanically connected to the board mounting assembly 300 by inserting a screw 412 into the screw hole 410. At this time, the positive terminal 402 is attached to the driving power source attachment holes 206a, the negative terminal 404 is attached to the driving power source attachment holes 206b, and the signal connection terminals 406 and 408 are attached to the control signal attachment holes 208. The positive terminal 402 is preferably soldered by a flow soldering process in a state of being attached to the driving power source attachment holes 206a. As a result, the positive terminal 402 is electrically connected to the driving power source attachment holes 206a. The negative terminal 404 is preferably soldered by a flow soldering process in a state of being attached to the driving power source attachment holes 206b. As a result, the negative terminal 404 is electrically connected to the driving power source attachment holes 206b.

Figure 5:
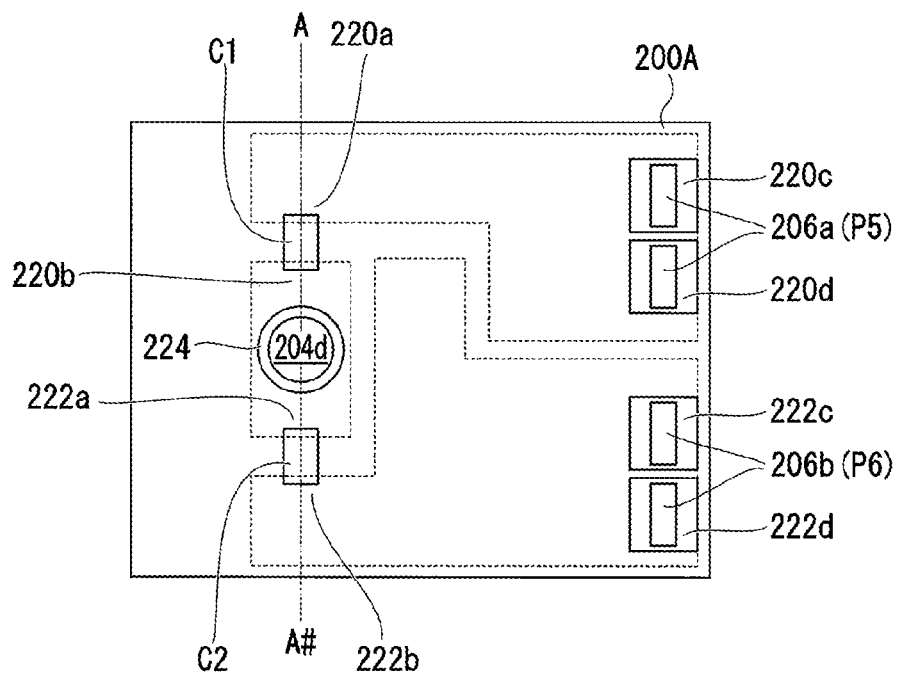
FIG. 5 is a plan view showing an example of a conductor pattern on the circuit board.
Figure 6:
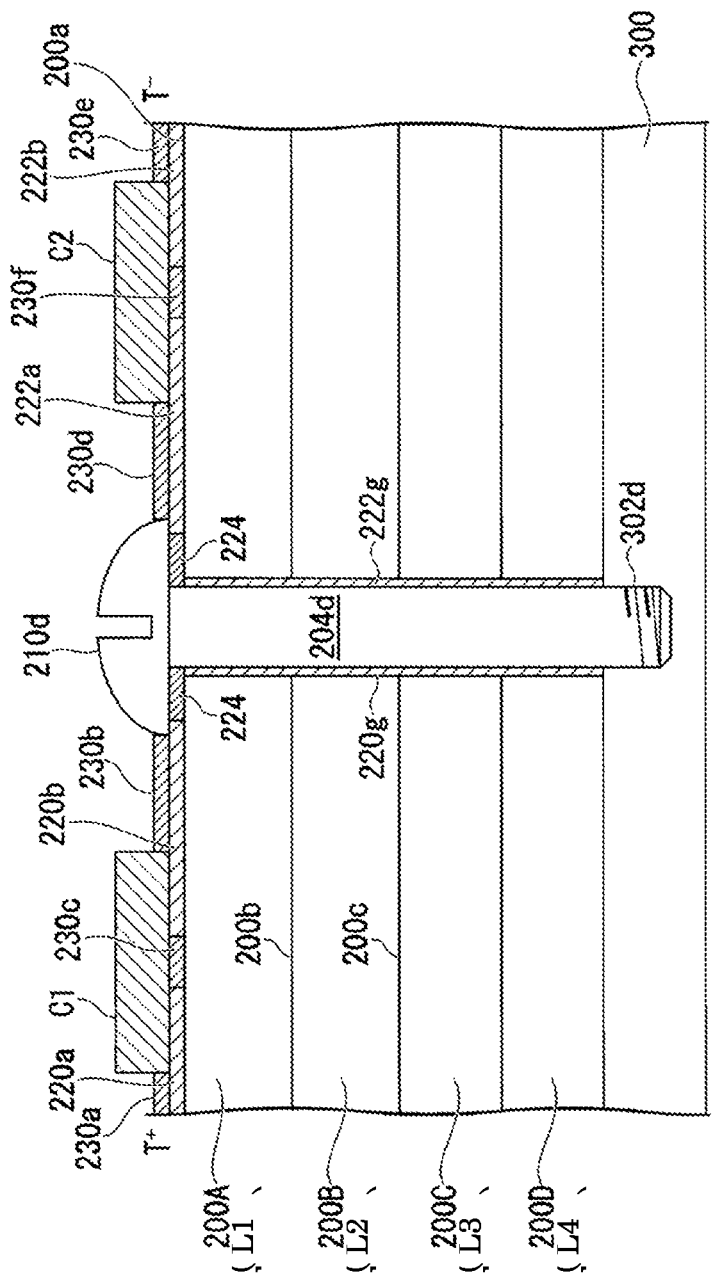
FIG. 6 is a cross-sectional view showing an example of an in-layer configuration of the circuit board.

FIG. 5 is a plan view showing an example of a conductor pattern on the circuit board 200. FIG. 6 is a cross-sectional view showing an example of an in-layer configuration in the circuit board 200, and is a cross-sectional view taken along line A-A# in FIG. 5.

The circuit board 200 is preferably a four-layer structure, for example, as shown in FIG. 6. That is, the circuit board 200 includes an L1 layer 200A, an L2 layer 200B, an L3 layer 200C, and an L4 layer 200D, for example. Those layers are stacked in the order of the L4 layer 200D, the L3 layer 200C, the L2 layer 200B, and the L1 layer 200A from the board mounting assembly 300 side. The L1 layer 200A is arranged on the cover assembly 100 side. The L4 layer 200D is located on the board mounting assembly 300 side, that is, the motor 33 side.

As shown in FIG. 5 and FIG. 6, the first capacitor C1, conductor patterns 220a and 220b, the through hole 204d, the second capacitor C2, conductor patterns 222a and 222b, and a conductor pattern 224 are provided in a surface (hereinafter referred to as a first surface 200a) of the L1 layer 200A on the cover assembly 100 side thereof. A resist 230a is provided on the conductor pattern 220a. A resist 230b is provided on the conductor pattern 220b. A resist 230c is provided between the first capacitor C1 and the L1 layer 200A. A resist 230d is provided on the conductor pattern 222a. A resist 230e is provided on the conductor pattern 222b. A resist 230f is provided between the second capacitor C2 and the L1 layer 200A. The conductor pattern 220a is electrically connected to the positive terminal T+. The first capacitor C1 and the conductor pattern 220a are electrically connected with each other. The first capacitor C1 and the conductor pattern 220b are electrically connected with each other. The conductor pattern 224 is provided around the through hole 204d in the first surface 200a. The conductor pattern 220b and the conductor pattern 224 are electrically connected with each other. The conductor pattern 224 is electrically connected with the screw 210d in a state in which the screw 210d is screwed as shown in FIG. 6. The conductor pattern 224 and the conductor pattern 222a are electrically connected with each other. The second capacitor C2 and the conductor pattern 222a are electrically connected with each other. The second capacitor C2 and the conductor pattern 222b are electrically connected with each other. The conductor pattern 222b is electrically connected to the negative terminal T−.

Note that, as shown in FIG. 5, the conductor pattern 220b and the conductor pattern 222a are directly connected with each other, but the configuration is not limited thereto. The first capacitor C1 and the second capacitor C2 only need to be electrically connected with each other and the first capacitor C1 and the second capacitor C2 only need to be electrically connected to the board mounting assembly 300 when the screw 210d is installed. That is, the conductor pattern 220b and the conductor pattern 222a is preferably connected to the conductor pattern 224 without being electrically connected with each other. In addition, the conductor pattern 220b and the conductor pattern 222a is preferably electrically connected to the conductor pattern 224 via the screw 210d when the conductor pattern 220b and the conductor pattern 222a are not connected to the conductor pattern 224 and the screw 210d is installed.

As shown in FIG. 5, conductor patterns 220c and 220d are preferably provided around the driving power source attachment holes 206a. The conductor patterns 220c and 220d are connected to the positive terminal 402 via solder by a flow soldering process. Conductor patterns 222c and 222d are provided around the driving power source attachment holes 206b. The conductor patterns 222c and 222d are preferably connected to the negative terminal 404 via solder by a flow soldering process. Note that, in FIG. 5, the conductor pattern of a region of the conductor pattern 222b that is between the conductor pattern 220b and the conductor pattern 220a is unnecessary. In addition, in FIG. 5, a resist is exposed in a region of the first surface 200a on which the conductor pattern is not provided.

In the L1 layer 200A, the L2 layer 200B, the L3 layer 200C, and the L4 layer 200D, an inlay (not shown) is provided in a through hole (not shown) penetrating through the L1 layer 200A to the L4 layer 200D in the thickness direction thereof. The inlay is preferably a material having excellent thermal efficiency such as copper embedded in a through hole having a diameter of several millimeters, for example. The FET 1 to the FET 6 are mounted on a surface of the circuit board 200 on the cover assembly 100 side thereof. The inlay and the through hole are arranged in the FET 1 to the FET 6 mounted on the L1 layer 200A on the board mounting assembly 300 side thereof. The inlay can transmit the heat caused by the switching of the FET 1 to the FET 6 to the board mounting assembly 300.

Note that, in the circuit board 200 shown in FIG. 6, the conductor pattern provided on the L1 layer 200A and the positive terminal T+ and the negative terminal T− are connected with each other, but the configuration is not limited thereto. The L2 layer 200B is preferably a power source layer connected to the positive terminal T+ via the board positive connection portion CN+. The L3 layer 200C may be a GND layer connected to the negative terminal T− via the board negative connection portion CN−.

As described above, in the electronic control circuit 32 of the present preferred embodiment, the screw 210d electrically connects the first capacitor C1 and the second capacitor C2 with each other and is electrically connected to the conductor pattern 224 and the board mounting assembly 300 in a state in which the screw 210d is screwed in the screw hole 302d. As a result, according the circuit board 200, the common mode noise is able to be reduced. That is, a conductor portion (screw 210d) is provided in the circuit board 200, and the conductor portion is electrically connected to the first capacitor C1, the second capacitor C2, the board positive connection portion CN+, and the board negative connection portion CN− and can be electrically connected to the board mounting assembly 300, which is at least partially a conductor and on which the circuit board 200 is mounted. As a result, according to the circuit board 200, current generated due to at least a portion of the common mode noise generated when the motor is driven is caused to flow to the board mounting assembly 300 via the conductor portion CON. As a result, the common mode noise is able to be reduced.

In addition, according to the circuit board 200, the through hole H (through hole 204d) penetrating through a board main body in the thickness direction thereof is provided, and at least a portion of the through hole is provided in a position that is between at least two of the first capacitor C1, the second capacitor C2, the board positive connection portion CN+, and the board negative connection portion CN−. As a result, according to the circuit board 200, the circuit board 200 can be mounted on the board mounting assembly 300 with use of the through hole. In that case, by using the screw 210d for the positioning between the circuit board 200 and the board mounting assembly 300, the current due to the noise generated when the motor is driven is caused to flow to the GND via the screw 210d. As a result, the circuit board 200 contributes to the reduction of the common mode noise.

The common mode noise is an alternating current (current including many AC components) generated by the fluctuation of the voltage applied to the coil of the motor 33. The common mode noise is transmitted to the board mounting assembly 300 via a stray capacitance of the coil of the motor 33, and is transmitted to the negative terminal T− of the battery 51 from the board mounting assembly 300 via a GND conductor such as the vehicle body. As a result, the electric potential (GND electric potential) of the negative terminal T− fluctuates. If there is no conductor portion CON, the common mode noise is transmitted to the board negative connection portion CN− via the board mounting assembly 300, the vehicle body, and the negative terminal T−, and defines a large loop.

Meanwhile, by providing the conductor portion CON between the first capacitor C1 and the second capacitor C2 as in this preferred embodiment, even when the common mode noise is transmitted to the board mounting assembly 300, the common mode noise is transmitted to the conductor portion CON, the first capacitor C1 and the second capacitor C2, and the board positive connection portion CN+ and the board negative connection portion CN− from the board mounting assembly 300, thus defining a smaller loop than a case without the conductor portion CON. In addition, the common mode noise has many AC components, and hence flows into the first capacitor C1 and the second capacitor C2 having a lower impedance than the vehicle body and the like. As a result, according to the circuit board 200, the loop of the common mode noise is able to be smaller than a case without the conductor portion CON and a contribution is able to be made to the reduction of the common mode noise.

Note that, for example, there is a concern that DC components in the noise may affect the circuit board 200 when the conductor portion CON is provided on a GND unit (board negative connection portion CN−) of the circuit board 200 and mounted on the board mounting assembly 300. The impedance of the GND conductor such as the vehicle body electrically connected to the board mounting assembly 300 fluctuates by a mechanical contact and the like of fastening portions between conductors. Since the impedance of the GND conductor such as the vehicle body fluctuates, the current flowing through the GND conductor such as the vehicle body also fluctuates. As a result, when the conductor portion CON is provided on the GND unit of the circuit board 200 and mounted on the board mounting assembly 300, there is a risk that the GND level becomes unstable and the operation of the motor driving device (power circuitry PC) becomes unstable. Providing the conductor portion CON between the first capacitor C1 and the second capacitor C2 as in this preferred embodiment prevents the circuit board 200 from being affected by the DC components in the noise.

In addition, according to the circuit board 200, when the through hole H is a screw hole, the common mode noise can be reduced only by a process of screwing the circuit board 200 and the board mounting assembly 300 together without adding a new process.

Further, according to the circuit board 200, the circuit board 200 preferably includes a first conductor pattern (224) provided around the through hole 204d, and hence the conductor pattern 224 can be made by the same process as that for the conductor pattern (220a and the like) that electrically connects the first capacitor C1 and the second capacitor C2 with each other and a new process is not added. Further, the effect of the noise reduction is able to be increased by increasing the area of the conductor pattern 224. Further, according to the circuit board 200, by providing conductor patterns 220g and 222g in the through hole 204d, a contact area between the screw 210d and the conductor patterns is able to be increased, and the effect of the noise reduction is able to be further increased.

Figure 7:
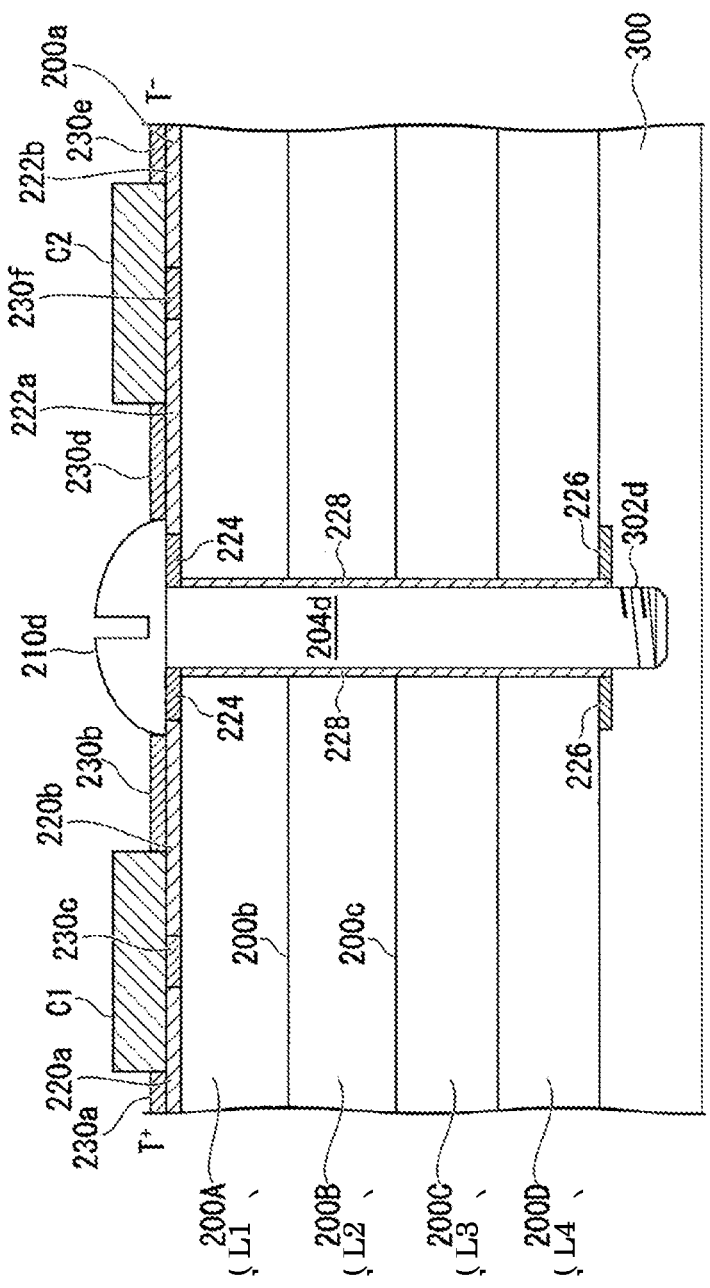
FIG. 7 is a cross-sectional view showing another example of an in-layer configuration of a circuit board of a preferred embodiment of the present invention.

FIG. 7 is a cross-sectional view showing another example of an in-layer configuration in the circuit board 200, and is a cross-sectional view taken along line A-A# in FIG. 5. The through hole 204d preferably includes the conductor pattern 224 provided on the first surface 200a, but may include a conductor 228 on an inner wall thereof instead of, or in addition to, the conductor pattern 224. The conductor 228 is electrically connected to a conductor pattern 226 provided on a surface of the L4 layer 200D on the board mounting assembly 300 side thereof. Further, the effect of the noise reduction is able to be further increased by increasing the area of the conductor 228. According to the circuit board 200, by providing the conductor 228 in the through hole 204d, a contact area between the screw 210d and the conductor is able to be increased, and the effect of the noise reduction is able to be increased. Further, according to the circuit board 200, the effect of the noise reduction is able to be further increased by increasing the area of the conductor pattern 224.

Figure 8:
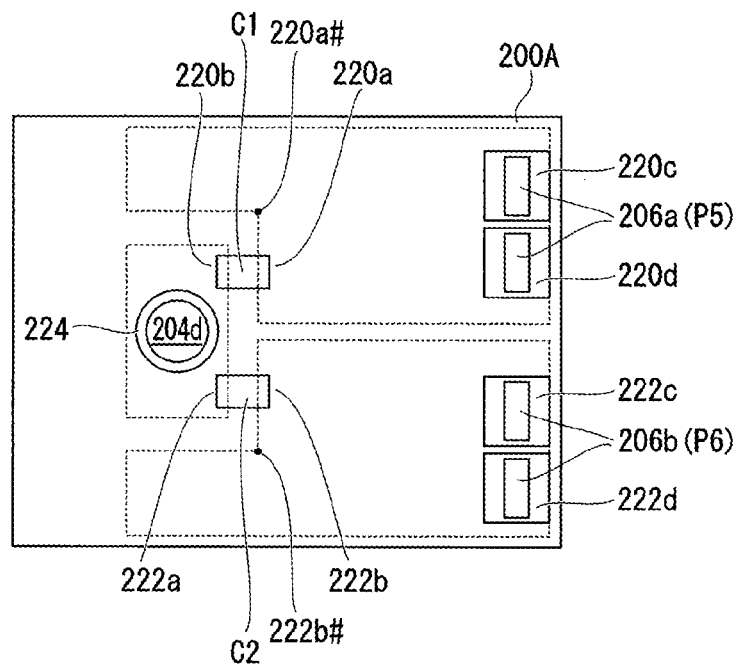
FIG. 8 is a plan view of another circuit board of a preferred embodiment of the present invention.

FIG. 8 is a plan view of another circuit board 200. As shown in FIG. 8, the conductor patterns may have shapes different from those in FIG. 5. In the conductor patterns, the conductor pattern 220a and the conductor pattern 222b preferably have symmetrical shapes with respect to a gap therebetween. In addition, the through hole 204d is provided in a region between a cutout portion 220a# of the conductor pattern 220a and a cutout portion 222b# of the conductor pattern 222b.

One end of the first capacitor C1 is installed in the cutout portion 220a# of the conductor pattern 220a. In addition, the conductor pattern 220b is provided on the other end side of the first capacitor C1 and connects the other end of the first capacitor C1 and the conductor pattern 220b with each other. The conductor pattern 220b is connected to the conductor pattern 224. The other end of the second capacitor C2 is installed on the cutout portion 222b# of the conductor pattern 222b. In addition, the conductor pattern 222a is provided on one end side of the second capacitor C2 and connects one end of the second capacitor C2 and the conductor pattern 222a with each other. The conductor pattern 222a is connected to the conductor pattern 224.

Figure 9:
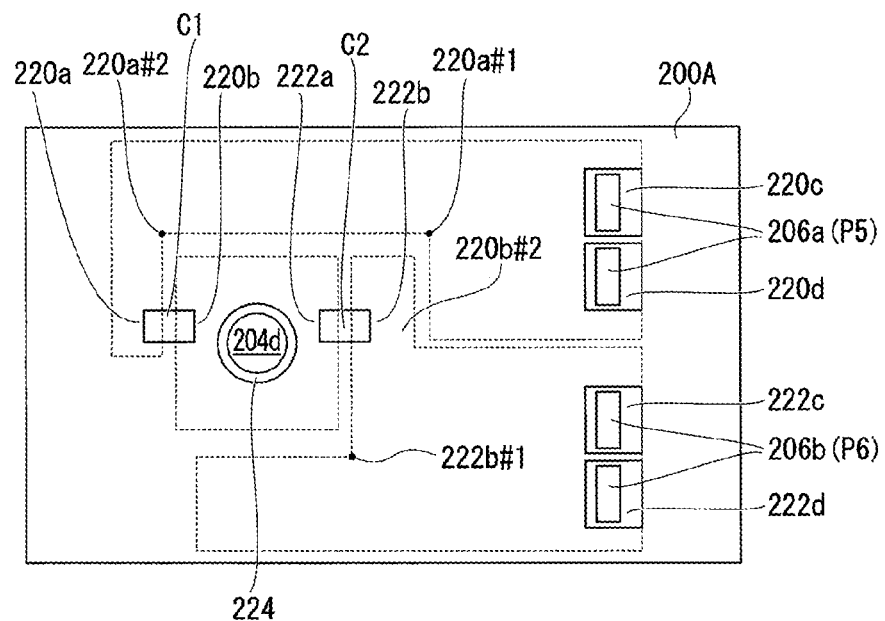
FIG. 9 is a plan view of another circuit board of a preferred embodiment of the present invention.

FIG. 9 is a plan view of another circuit board 200. The conductor pattern 220a preferably includes two cutout portions 220a#1 and 220a#2. The conductor pattern 222b includes a cutout portion 222b#1 and a protrusion 222b#2.

The through hole 204d, the conductor pattern 220b, and the conductor pattern 222a are provided in a region surrounded by the cutout portions 220a#1, 220a#2, and 222b#1, and the protrusion 220b#2.

Even the circuit board 200 including the conductor patterns shown in FIG. 8 or FIG. 9 contributes to the reduction of the common mode noise as in the present preferred embodiment.

Figure 10:
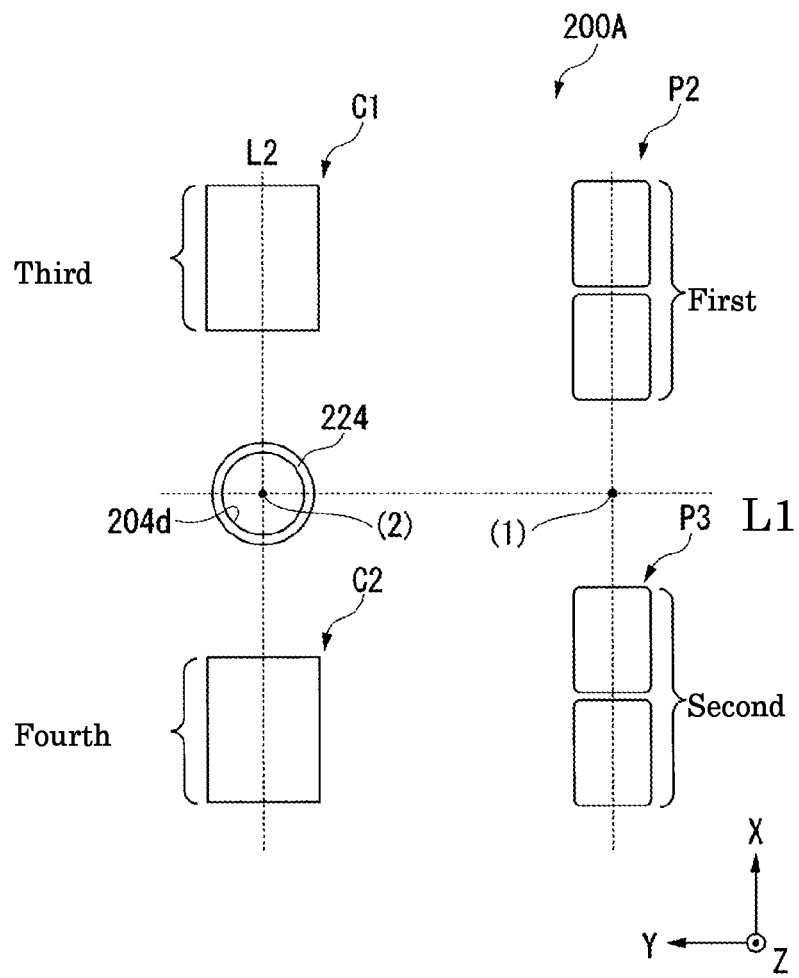
FIG. 10 is a schematic view showing an example of a positional relationship between a through hole, a first capacitor, a second capacitor, driving power source attachment holes, and driving power source attachment holes of a preferred embodiment of the present invention.

FIG. 10 is a schematic view showing an example of a positional relationship between the through hole 204d, the first capacitor C1, the second capacitor C2, the driving power source attachment holes 206a (P2), and the driving power source attachment holes 206b (P3). When a first line L1 passing through a middle point (1) between a position P2 of the board positive connection portion CN+, that is, the position of the driving power source attachment holes 206a and a position P3 of the board negative connection portion CN−, that is, the position of the driving power source attachment holes 206b and a middle point (2) between the first capacitor C1 and the second capacitor C2 is given, at least a portion of the through hole 204d is provided in a position in which the first line L1 intersects with a second line L2 connecting the first capacitor C1 and the second capacitor C2 with each other.

The circuit board 200 preferably defines a current loop including the through hole 204d when the cover assembly 100 and the board mounting assembly 300 are screwed thereon. The current loop with the through hole 204d is smaller than a current loop without the through hole 204. As a result, according to the circuit board 200, the current due to the noise generated when the motor is driven is able to be caused to flow to the board positive connection portion CN+ and the board negative connection portion CN− via the conductor portion CON in the through hole 204d, and the first capacitor C1 and the second capacitor C2, and hence a contribution is able to be made to the reduction of the common mode noise.

As shown in FIG. 10, in the circuit board 200, the driving power source attachment holes 206a is preferably provided in a first position in a first direction, the driving power source attachment holes 206b is preferably provided in a second position in the first direction, and at least a portion of the through hole 204d is preferably provided in a position between the first position and the second position in the first direction. The first direction is a direction in which a line connecting the position in which the driving power source attachment holes 206a are defined and the position in which the driving power source attachment holes 206b are defined with each other extends. The first position is a position in which the driving power source attachment holes 206a are able to be provided and is a position to which the positive terminal 402 is connected. The second position is a position in which the driving power source attachment holes 206b are able to be provided and is a position to which the negative terminal 404 is connected. Even in that case, the circuit board 200 is able to define a current loop including the through hole 204d. The current loop with the through hole 204d is smaller than a current loop without the through hole 204.

As shown in FIG. 10, in the circuit board 200, the first capacitor C1 is preferably provided in a third position in a second direction, the second capacitor C2 is preferably provided in a fourth position in the second direction, and at least a portion of the through hole 204d is preferably provided in a position between the third position and the fourth position in the second direction. The second direction is a direction in which a line connecting the position in which the first capacitor C1 is defined and the position in which the second capacitor C2 is defined with each other extends. The third position is a position in which the first capacitor C1 is mounted and is a position at which the conductor pattern extending from the board positive connection portion CN+ is connected to the first capacitor C1. The fourth position is a position in which the second capacitor C2 is mounted and is a position at which the conductor pattern extending from the board negative connection portion CN− is connected to the second capacitor C2. Even in that case, the circuit board 200 is able to define a current loop including the through hole 204d. The current loop with the through hole 204d is smaller than a current loop without the through hole 204.

Note that, in FIG. 10, the direction connecting the driving power source attachment holes 206a and 206b with each other is referred to as the first direction, but the second direction connecting the first capacitor C1 and the second capacitor C2 with each other may be a direction different from the first direction.

Figure 11:
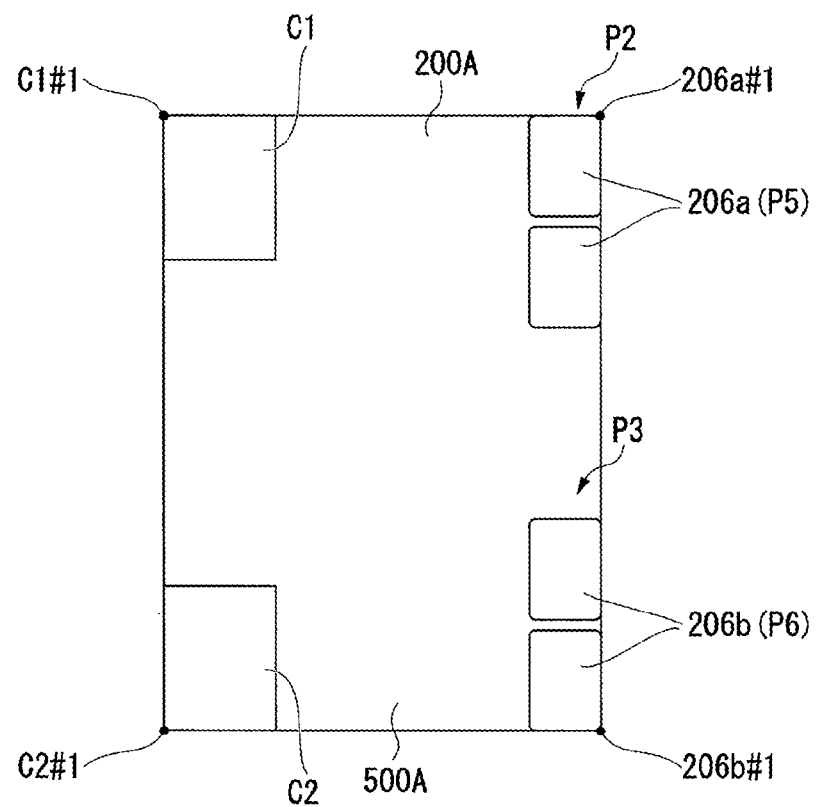
FIG. 11 is a view for describing a region in which the through hole may be provided.

FIG. 11 is a view for describing a region in which the through hole 204d is preferably provided. At least a portion of the through hole 204d is preferably provided in a region 500A surrounded by an outer end portion 206a#1 of the driving power source attachment holes 206a, an outer end portion 206b#1 of the driving power source attachment holes 206b, an outer end portion C1#1 of the first capacitor C1, and an outer end portion C2#1 of the second capacitor C2. Even in that case, the circuit board 200 defines a current loop including the through hole 204d. The current loop with the through hole 204d is smaller than a current loop without the through hole 204.

Figure 12:
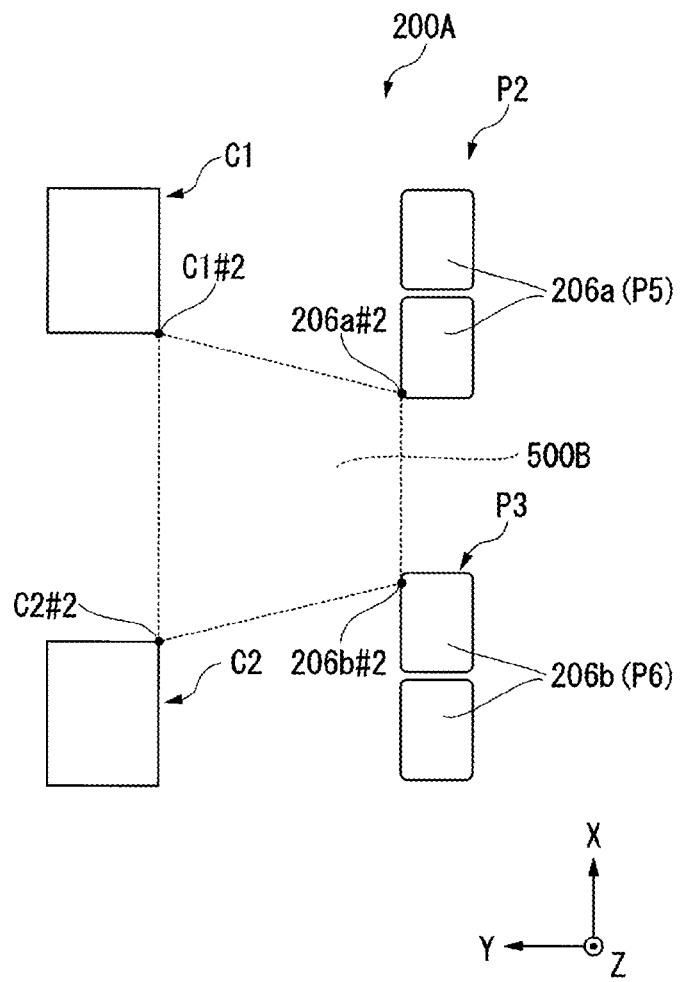
FIG. 12 is a view for describing another region in which the through hole may be provided.

FIG. 12 is a view for describing another region in which the through hole 204d is provided. At least a portion of the through hole 204d is preferably provided in a region 500B surrounded by an inner end portion 206a#2 of the driving power source attachment holes 206a, an inner end portion 206b#2 of the driving power source attachment holes 206b, an inner end portion C1#2 of the first capacitor C1, and an inner end portion C2#2 of the second capacitor C2. Even in that case, the circuit board 200 is able to define a current loop including the through hole 204d. The current loop with the through hole 204d is smaller than a current loop without the through hole 204.

Figure 13:
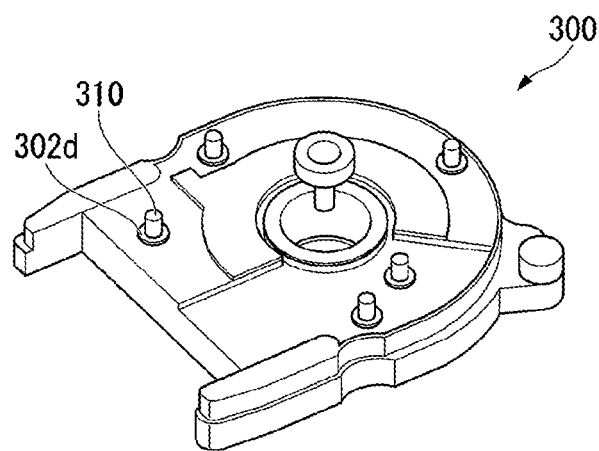
FIG. 13 is a perspective view showing an example of a board mounting assembly of a modified example of a preferred embodiment of the present invention.

FIG. 13 is a perspective view showing an example of the board mounting assembly 300 of a modified example of a preferred embodiment of the present invention. The board mounting assembly 300 preferably includes a protrusion 310 instead of the screw hole 302d. The protrusion 310 is defined by a conductor. The protrusion 310 is preferably connected to the ground electric potential GND. The protrusion 310 closes the screw hole 302d and is mounted on a surface of the closed screw hole 302d, for example. The protrusion 310 is electrically connected to the first capacitor C1 and the second capacitor C2 when the circuit board 200 is mounted on the board mounting assembly 300, for example. In addition, when a conductor that is electrically connected to the first capacitor C1 and the second capacitor C2 is provided on the inner wall of the through hole 204d, the protrusion 310 is preferably electrically connected to the conductor. Even in that case, the circuit board 200 preferably defines a current loop including the through hole 204d. The current loop with the through hole 204d is smaller than a current loop without the through hole 204.

Preferred embodiments of the present invention can be used in a circuit board and a control device, for example.

Features of the above-described preferred embodiments and the modifications thereof may be combined appropriately as long as no conflict arises.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A circuit board, comprising:
a board main body;
circuitry provided on the board main body that supplies electric power to a motor;
a positive-electrode-side power source terminal portion provided on the board main body and connected to a positive electrode terminal of the circuitry; and
a negative-electrode-side power source terminal portion provided on the board main body and connected to a negative electrode terminal of the circuitry; wherein
the circuitry includes:
a first capacitor connected to the positive-electrode-side power source terminal portion; and
a second capacitor connected to the negative-electrode-side power source terminal portion;
the first capacitor and the second capacitor are connected in series between the positive-electrode-side power source terminal portion and the negative-electrode-side power source terminal portion;
the board main body includes a through hole penetrating through the board main body in a thickness direction;
at least a portion of the through hole is provided in a position between at least two of the first capacitor, the second capacitor, the positive-electrode-side power source terminal portion, and the negative-electrode-side power source terminal portion; and
the at least a portion of the through hole is provided in a region surrounded by outer end portions of the positive-electrode-side power source terminal portion and the negative-electrode-side power source terminal portion and outer end portions of the first capacitor and the second capacitor.

2. The circuit board according to claim 1, further comprising a conductor portion provided in at least a portion of the through hole, wherein
the conductor portion is electrically connected to the positive-electrode-side power source terminal portion via the first capacitor, electrically connected to the negative-electrode-side power source terminal portion via the second capacitor, and is capable of being electrically connected to an assembly which is at least partially a conductor and on which the board main body is mounted.

3. The circuit board according to claim 2, wherein the conductor portion is a first conductor pattern provided around the through hole.

4. The circuit board according to claim 2, wherein the conductor portion is a second conductor pattern provided on an inner wall of the through hole.

5. The circuit board according to claim 1, wherein
the positive-electrode-side power source terminal portion is provided in a first position in a first direction, and the negative-electrode-side power source terminal portion is provided in a second position in the first direction; and
the at least a portion of the through hole is provided in a position between the first position and the second position in the first direction.

6. The circuit board according to claim 2, wherein
the positive-electrode-side power source terminal portion is provided in a first position in a first direction, and the negative-electrode-side power source terminal portion is provided in a second position in the first direction; and
the at least a portion of the through hole is provided in a position between the first position and the second position in the first direction.

7. The circuit board according to claim 1, wherein
the first capacitor is provided in a third position in a second direction, and the second capacitor is provided in a fourth position in the second direction; and
the at least a portion of the through hole is provided in a position between the third position and the fourth position in the second direction.

8. The circuit board according to claim 2, wherein
the first capacitor is provided in a third position in a second direction, and the second capacitor is provided in a fourth position in the second direction; and
the at least a portion of the through hole is provided in a position between the third position and the fourth position in the second direction.

9. The circuit board according to claim 2, wherein the at least a portion of the through hole is provided in a region surrounded by outer end portions of the positive-electrode-side power source terminal portion and the negative-electrode-side power source terminal portion and outer end portions of the first capacitor and the second capacitor.

10. The circuit board according to claim 1, wherein the at least a portion of the through hole is provided in a region surrounded by inner end portions of the positive-electrode-side power source terminal portion and the negative-electrode-side power source terminal portion and inner end portions of the first capacitor and the second capacitor.

11. The circuit board according to claim 2, wherein the at least a portion of the through hole is provided in a region surrounded by inner end portions of the positive-electrode-side power source terminal portion and the negative-electrode-side power source terminal portion and inner end portions of the first capacitor and the second capacitor.

12. The circuit board according to claim 1, wherein, when a first line passing through a middle point between the positive-electrode-side power source terminal portion and the negative-electrode-side power source terminal portion and a middle point between the first capacitor and the second capacitor is provided, the at least a portion of the through hole is provided in a position at which the first line intersects with a second line connecting the first capacitor and the second capacitor with each other.

13. The circuit board according to claim 2, wherein, when a first line passing through a middle point between the positive-electrode-side power source terminal portion and the negative-electrode-side power source terminal portion and a middle point between the first capacitor and the second capacitor is provided, the at least a portion of the through hole is provided in a position at which the first line intersects with a second line connecting the first capacitor and the second capacitor with each other.

14. A control device, comprising:
the circuit board according to claim 1;
an assembly which includes a conductive section on at least a portion thereof and on which the circuit board is mounted; and a conductor that electrically connects the conductive section, the first capacitor, the second capacitor, the positive-electrode-side power source terminal portion, and the negative-electrode-side power source terminal portion with each other.

15. A control device, comprising:

the circuit board according to claim 2;

an assembly which includes a conductive section on at least a portion thereof and on which the circuit board is mounted; and a conductor that electrically connects the conductive section, the first capacitor, the second capacitor, the positive-electrode-side power source terminal portion, and the negative-electrode-side power source terminal portion with each other.

16. A control device, comprising:

the circuit board according to claim 3;

an assembly which includes a conductive section on at least a portion thereof and on which the circuit board is mounted; and a conductor that electrically connects the conductive section, the first capacitor, the second capacitor, the positive-electrode-side power source terminal portion, and the negative-electrode-side power source terminal portion with each other.

17. A control device, comprising:

the circuit board according to claim 4;

an assembly which includes a conductive section on at least a portion thereof and on which the circuit board is mounted; and a conductor that electrically connects the conductive section, the first capacitor, the second capacitor, the positive-electrode-side power source terminal portion, and the negative-electrode-side power source terminal portion with each other.

18. The control device according to claim 14, wherein:

the section including the conductor includes a screw hole defined therein; and the conductor is a conductive screw that penetrates through the through hole and the screw hole.

* * * * *